(12) United States Patent
Lee et al.

(10) Patent No.: US 11,597,653 B2
(45) Date of Patent: Mar. 7, 2023

(54) HYBRID STRUCTURE USING GRAPHENE-CARBON NANOTUBE AND PEROVSKITE SOLAR CELL USING THE SAME

(71) Applicant: Pusan National University Industry—University Cooperation Foundation, Busan (KR)

(72) Inventors: Hyung Woo Lee, Busan (KR); Soon Kyu Hong, Suwon-si (KR); Chae Young Woo, Changwon-si (KR); Yeong Su Jo, Gimhae-si (KR); Sung Min Kim, Busan (KR); Luhe Li, Busan (KR); Seung hoon Oh, Busan (KR); Yeonggwon Kim, Busan (KR)

(73) Assignee: Pusan National University Industry-University Cooperation Foundation, Busan (KR)

( * ) Notice: Subject to any disclaimer, the term of this patent is extended or adjusted under 35 U.S.C. 154(b) by 65 days.

(21) Appl. No.: 16/941,995

(22) Filed: Jul. 29, 2020

(65) Prior Publication Data
US 2021/0032108 A1    Feb. 4, 2021

(30) Foreign Application Priority Data
Jul. 31, 2019 (KR) ......... 10-2019-0093241

(51) Int. Cl.
*H01L 31/0216* (2014.01)
*H01L 31/0224* (2006.01)
(Continued)

(52) U.S. Cl.
CPC .......... *C01B 32/168* (2017.08); *C01B 32/194* (2017.08); *H01L 31/02167* (2013.01);
(Continued)

(58) Field of Classification Search
CPC ................. H01L 51/00–56; H01L 51/42–424
See application file for complete search history.

(56) References Cited

U.S. PATENT DOCUMENTS

| | | | | |
|---|---|---|---|---|
| 2012/0128983 A1* | 5/2012 | Yoon | ...... | B82Y 40/00 428/408 |
| 2017/0331069 A1* | 11/2017 | Song | ...... | H01L 51/5203 |

FOREIGN PATENT DOCUMENTS

| | | | |
|---|---|---|---|
| CN | 105036114 A | * | 11/2015 |
| KR | 10-2015-0033867 A | | 4/2015 |
| KR | 10-1723797 B1 | | 4/2017 |

OTHER PUBLICATIONS

Liu, et al. "Ultratransparentand stretchable graphene electrodes." Science advances 3.9 (2017): e1700159.*

(Continued)

*Primary Examiner* — Golam Mowla
(74) *Attorney, Agent, or Firm* — JCIPRNET (57) ABSTRACT

Disclosed are a hybrid structure using a graphene-carbon nanotube and a perovskite solar cell using the same. The hybrid structure includes a graphene-carbon nanotube formed by laminating a second graphene coated with a polymer on an upper surface of a first graphene coated with a carbon nanotube. The perovskite solar cell includes: a substrate; a first electrode formed on the substrate and including a fluorine doped thin oxide (FTO); an electron transfer layer formed on the first electrode and including a compact-titanium oxide (c-TiO$_2$); a mesoporous-titanium oxide (m-TiO$_2$) formed on the electron transfer layer; a perovskite layer formed on the m-TiO$_2$ and including a perovskite compound; and a graphene-carbon nanotube hybrid structure formed on the perovskite layer.

5 Claims, 5 Drawing Sheets (51) Int. Cl.
*H01L 31/032* (2006.01)
*H01L 31/0392* (2006.01)
*C01B 32/168* (2017.01)
*C01B 32/194* (2017.01)

(52) U.S. Cl.
CPC .............. *H01L 31/022425* (2013.01); *H01L 31/022475* (2013.01); *H01L 31/0323* (2013.01); *H01L 31/0327* (2013.01); *H01L 31/0392* (2013.01); *C01P 2004/13* (2013.01); *C01P 2004/80* (2013.01)

(56) References Cited

OTHER PUBLICATIONS

Li, et al. "Transparent, Flexible Heater Based on Hybrid 2D Platform of Graphene and Dry-Spun Carbon Nanotubes." ACS applied materials & interfaces 11.17 (2019): 16223-16232.*
Ishikawa, et al., "Perovskite/graphene solar cells without a hole-transport layer." ACS Applied Energy Materials 2.1 (2019): 171-175.*
Ishikawa, et al. "Modified solvent bathing method for forming high quality perovskite films." Thin Solid Films 661 (2018): 60-64.*
You, et al. "Efficient semitransparent perovskite solar cells with graphene electrodes." Advanced materials 27.24 (2015): 3632-3638.*
Lin, et al. "Development of an ultra-thin film comprised of a graphene membrane and carbon nanotube vein support." Nature communications 4.1 (2013): 1-7.*
13382. 7440-50-8 | Copper foil, 0.025mm (0.001 in) thick, annealed, coated, 99.8% (metals basis) | 13382 | Alfa Aesar Alfa Aesar. (Apr. 27, 2015). https://web.archive.org/web/20150427051805/https://www.alfa.com/en/catalog/13382/.*

* cited by examiner

HYBRID STRUCTURE USING GRAPHENE-CARBON NANOTUBE AND PEROVSKITE SOLAR CELL USING THE SAME

CROSS-REFERENCE TO RELATED APPLICATIONS

This application claims priority to and the benefit of Korean Patent Application No. 10-2019-0093241 filed on Jul. 31, 2019, which is hereby incorporate by reference in its entirety.

BACKGROUND

The present invention relates to a hybrid structure using a graphene-carbon nanotube and a perovskite solar cell using the same, and more particularly, to a hybrid structure using a graphene-carbon nanotube capable of maintaining the efficiency of a solar cell even in humid and oxygen conditions, a preparation method thereof, a perovskite solar cell using the same, and a preparation method of the perovskite solar cell.

Graphene is a material with excellent mechanical and electrical properties, and has been widely used in many research fields such as mechanical and semiconductor fields. The graphene is synthesized by thermal chemical vapor deposition (CVD). At this time, a metal catalyst is necessarily required for graphene synthesis, and generally synthesized in the form of graphene/metal catalyst.

The carbon nanotube (CNT) has a shape of rolling graphene, and a hollow tube. The electrical characteristics thereof vary depending on a rolling direction and the number of walls, and the carbon nanotube periodically has a semiconductor or metallic property. Like the graphene, the carbon nanotube is applicable in many fields due to excellent mechanical, electrical, and thermal properties, and synthesized by thermal chemical vapor deposition.

Researches on low-dimensional carbon materials, such as carbon nanotubes (CNTs) and graphene, have been actively conducted for application as transparent and flexible next-generation electronic devices, such as transparent electrodes, transparent transistors, and transparent sensors due to excellent mechanical, electrical, thermal, and optical properties.

Among alternative energies for fossil fuel depletion, research on a solar cell using sunlight has been continuously conducted. Among these solar cells, a perovskite solar cell is growing at a faster rate than other types of solar cells since 2009. However, a spiro-OMeTAD material used in a hole conductive layer has a problem of rapidly decreasing the efficiency of the solar cell by rapidly deteriorating its properties in a humidity and oxygen conditions.

Therefore, in order to compensate for the above-mentioned problems, the present inventors have recognized an urgent need to develop a hybrid structure using a graphene-carbon nanotube capable of maintaining the efficiency of the solar cell even in the humidity and oxygen conditions and then completed the present invention.

PRIOR ART

Patent Document (Patent Document 1) Korean Patent Publication No. 10-2015-0033867

(Patent Document 2) Korean Patent Registration No. 10-1723797

SUMMARY

An object of the present invention is to provide a hybrid structure using a graphene-carbon nanotube which hardly reacts or corrodes even under humid and oxygen conditions and is applied to a hole conductive layer of a perovskite solar cell to replace existing spiro-OMeTAD and maintain the photovoltaic conversion efficiency of the solar cell.

Another object of the present invention is to provide a method for preparing a hybrid structure using a graphene-carbon nanotube which is performed under a normal conductions and easily applied to large-scale industry because side reactions hardly occur.

The objects of the present invention are not limited to the aforementioned objects, and other objects, which are not mentioned above, will be apparently understood to those skilled in the art from the following description.

In order to achieve the objects, the present invention provides a hybrid structure using a graphene-carbon nanotube capable of maintaining the efficiency of a solar cell even in humid and oxygen conditions, a preparation method thereof, a perovskite solar cell using the same, and a preparation method of the perovskite solar cell.

Hereinafter, this specification will be described in more detail.

The present invention provides a hybrid structure comprising a graphene-carbon nanotube formed by laminating a second graphene coated with a polymer on an upper surface of a first graphene coated with a carbon nanotube.

In the present invention, the polymer may be at least one selected from the group consisting of poly(methyl methacrylate) (PMMA), poly(bisphenol A carbonate) (PC), polyvinylidenefluoride-hexafluoropropylene (PVDF-HFP), polyethylene oxide (PEO), polyacrylonitrile (PAN), and polyvinylalcohol (PVA).

The present invention provides a method for preparing a hybrid structure comprising the following steps:

(A1) preparing a first graphene coated with a carbon nanotube by dry-spinning the carbon nanotube in a film form on an upper surface of a graphene synthesized on a copper foil surface;

(A2) preparing a second graphene coated with a polymer by spin-coating and curing the polymer on the upper surface of the graphene synthesized on the copper foil surface; and (A3) preparing a graphene-carbon nanotube hybrid structure by laminating the second graphene on the upper surface of the first graphene.

In the present invention, the step (A1) may be constituted by the following steps:

(A1a) dry-spinning the carbon nanotube in the form of a film on the upper surface of the graphene synthesized on the copper foil surface;

(A1b) bonding the carbon nanotube to the upper surface of the graphene by spraying alcohol onto the graphene from which the carbon nanotube is spun; and (A1c) preparing the first graphene with the carbon nanotube coated on the upper surface by drying the alcohol.

In the present invention, the step (A2) may be constituted by the following steps:

(A2a) spin-coating and curing the polymer on the upper surface of graphene synthesized on the copper foil surface;

(A2b) removing the copper by adding the graphene to a copper etchant solution after the completion of the step (A2a); and (A2c) preparing the second graphene coated with the polymer by putting the graphene in deionized water to remove the copper etchant solution.

In the present invention, the step (A3) may be constituted by the following steps:

(A3a) laminating the second graphene on the upper surface of the first graphene; and (A3b) after the step (A3a) is completed, preparing a graphene-carbon nanotube hybrid structure by adding the copper foil to the copper etchant solution to remove the copper foil used for the synthesis of the first graphene.

Further, the present invention provides a perovskite solar cell comprising: a substrate (glass); a first electrode formed on the substrate and including a fluorine doped thin oxide (FTO); an electron transfer layer formed on the first electrode and including a compact-titanium oxide (c-TiO$_2$); a mesoporous-titanium oxide (m-TiO$_2$) formed on the electron transfer layer; a perovskite layer formed on the m-TiO$_2$ and including a perovskite compound; and a graphene-carbon nanotube hybrid structure formed on the perovskite layer.

In the present invention, the perovskite compound may be methylammonium lead iodide (MAPbI$_3$).

Further, the present invention provides a preparation method of a perovskite solar cell comprising the following steps:

(B1) laminating a fluorine doped tin oxide (FTO) on a substrate, and sequentially laminating and spin-coating a compact-titanium oxide (c-TiO$_2$) and a mesoporous-titanium oxide (m-TiO$_2$);

(B2) after the completion of the spin-coating, performing annealing at 450 to 550° C.;

(B3) after the completion of the annealing, preparing a substrate on which a perovskite layer is formed by spin-coating a perovskite compound on the m-TiO$_2$; and (B4) laminating the graphene-carbon nanotube hybrid structure on the perovskite layer with a laminator to prepare a perovskite solar cell.

In the present invention, the step (B4) may be constituted by the following steps:

(B4a) laminating the graphene-carbon nanotube hybrid structure on the substrate on which the perovskite layer prepared in the step (B3) is formed; and (B4b) preparing the perovskite solar cell to which the graphene-carbon nanotube hybrid structure is adhered by pressing the laminated substrate at 90 to 120° C. using laminator.

All details mentioned in the hybrid structure using the graphene-carbon nanotube, the preparation method thereof, the perovskite solar cell using the same, and the preparation method of the perovskite solar cell are equally applied unless contradicted.

According to the present invention, since a hybrid structure using a graphene-carbon nanotube hardly reacts or corrodes even under humid and oxygen conditions and is applied to a hole conductive layer of a perovskite solar cell, it is possible to replace existing spiro-OMeTAD and maintain the photovoltaic conversion efficiency of a solar cell.

According to the present invention, since a preparation method of the hybrid structure using the graphene-carbon nanotube is performed under a normal condition and side reactions hardly occur, it is possible to be easily applied to large-scale industry.

The effects of the present invention are not limited to the aforementioned effect, and other effects, which are not mentioned above, will be apparently understood to those skilled in the art from the description of the claims.

DETAILED DESCRIPTION

Terms used in the present specification adopt general terms which are currently widely used as possible by considering functions in the present invention, but the terms may be changed depending on an intention of those skilled in the art, a precedent, emergence of new technology, etc. Further, in a specific case, a term which an applicant arbitrarily selects is present and in this case, a meaning of the term will be disclosed in detail in a corresponding description part of the invention. Accordingly, the term used in the present invention should be defined based on not just a name of the term but a meaning of the term and contents throughout the present invention.

Unless contrarily defined, all terms used herein including technological or scientific terms have the same meanings as those generally understood by a person with ordinary skill in the art. Terms which are defined in a generally used dictionary should be interpreted to have the same meaning as the meaning in the context of the related art, and are not interpreted as an ideal meaning or excessively formal meanings unless clearly defined in the present application.

The numerical range includes numerical values defined in the above range. All maximum numerical limits given throughout this specification include all lower numerical limits as if the lower numerical limits are clearly written. All minimum numerical limits given throughout this specification include all higher numerical limits as if the higher numerical limits are clearly written. All numerical limits given throughout this specification will include all better numerical ranges within a broader numerical range, as if narrower numerical limits are clearly written.

Hereinafter, embodiments of the present invention will be described in detail, but it will be apparent that the present invention is not limited by the following embodiments.

Hybrid Structure Using Graphene-Carbon Nanotube

The present invention provides a hybrid structure using a graphene-carbon nanotube.

The term "graphene" used in the present invention refers to a carbon allotrope having a structure in which carbon atoms are gathered to form a two-dimensional plane.

The term "carbon nanotube (CNT)" used in the present invention refers to a carbon allotrope in the form of a tube in which hexagons made of 6 carbons are connected to each other to form a tube shape.

The term "hybrid structure" used in the present invention means a general term for a synthetic structure or a mixed structure in which two or more kinds are composed of heterogeneous materials.

Figure 1:
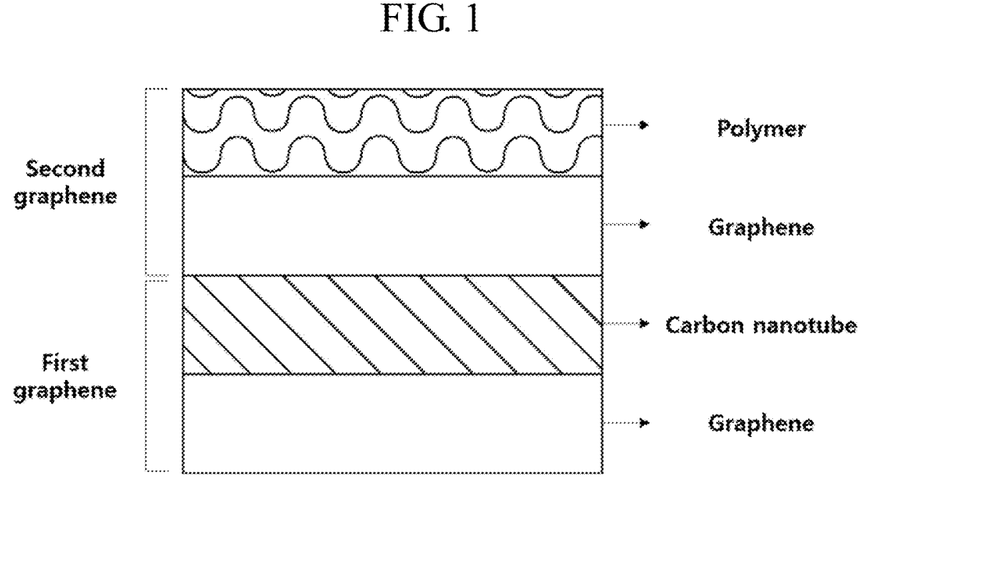
FIG. 1 is a cross-sectional view of a hybrid structure including a graphene-carbon nanotube of the present invention.

Referring to FIG. 1, the hybrid structure may be formed by laminating a second graphene coated with a polymer on an upper surface of a first graphene coated with a carbon nanotube.

The first graphene may be formed by coating the carbon nanotube on the upper surface of the graphene in a two-dimensional planar shape. More specifically, the first graphene may be formed by dry-spinning and coating the carbon nanotube on the upper surface of the two-dimensional planar graphene.

In addition, the second graphene may be formed by coating the polymer on the upper surface of the two-dimensional planar graphene.

The polymer may be at least one selected from the group consisting of poly(methyl methacrylate) (PMMA), poly(bisphenol A carbonate) (PC), polyvinylidenefluoride-hexafluoropropylene (PVDF-HFP), polyethylene oxide (PEO), polyacrylonitrile (PAN), and polyvinylalcohol (PVA), and more preferably poly(methyl methacrylate) and poly(bisphenol A carbonate).

The hybrid structure using the graphene-carbon nanotube of the present invention hardly corrodes or reacts even under humid and oxygen conditions and is applied to a hole conductive layer of a perovskite solar cell to replace existing spiro-OMeTAD.

Preparation Method of Hybrid Structure Using Graphene-Carbon Nanotube

The present invention provides a method for preparing of a hybrid structure comprising the following steps:

(A1) preparing a first graphene coated with a carbon nanotube by dry-spinning the carbon nanotube in a film form on an upper surface of a graphene synthesized on a copper foil surface;

(A2) preparing a second graphene coated with a polymer by spin-coating and curing the polymer on the upper surface of the graphene synthesized on the copper foil surface; and (A3) preparing a graphene-carbon nanotube hybrid structure by laminating the second graphene on the upper surface of the first graphene.

The hybrid structure is the hybrid structure using the aforementioned graphene-carbon nanotube, and is applied equally unless contradicted to each other.

In the present invention, the step (A1) may be constituted by the following steps:

(A1a) dry-spinning the carbon nanotube in the form of a film on the upper surface of the graphene synthesized on the copper foil surface;

(A1b) bonding the carbon nanotube to the upper surface of the graphene by spraying alcohol onto the graphene from which the carbon nanotube is spun; and (A1c) preparing the first graphene with the carbon nanotube coated on the upper surface by drying the alcohol.

The graphene may be synthesized and prepared on the surface of the copper foil.

More specifically, a copper foil of high-purity is put in a hydrogen ($H_2$) atmosphere in a furnace of 1,000° C. to 1,100° C. for 30 minutes. In addition, the graphene synthesized on the surface of the copper foil may be prepared by reacting the copper foil in a methane ($CH_4$) conditions for 30 minutes and cooling the furnace to room temperature.

The carbon nanotube may be prepared using an $SiO_2$ wafer substrate on which an iron (Fe) catalyst layer and an alumina ($Al_2O_3$) layer are deposited.

More specifically, 3 nm-thick alumina is deposited on an Si wafer substrate having an oxide layer by evaporation of an electron beam, and then 3 to 4 nm-thick iron is deposited on the upper surface thereof. Then, the $SiO_2$ wafer substrate on which the iron catalyst is deposited is placed in a furnace of 500 to 550° C. in an argon (Ar) gas conditions and reacts for 0.5 to 3 minutes in a hydrogen ($H_2$) gas conditions. Next, the furnace is heated to 650 to 700° C., the carbon nanotube is grown in an acetylene ($C_2H_2$) and hydrogen ($H_2$) conditions, and the furnace is cooled to room temperature to prepare the vertically aligned carbon nanotube.

The dry-spinning used in the step (A1a) may be performed by van der waals force.

In the step (A1b), alcohol may be sprayed onto the graphene in order to more easily bond the carbon nanotube to the upper surface of the graphene synthesized on the surface of the copper foil.

The alcohol is preferably a low alcohol of $C_1$ to $C_4$ such as methanol, ethanol, n-butanol, and isopropanol, but is not limited thereto as long as it is an alcohol that is easy to dry after spraying the alcohol.

The drying performed in the step (A1c) may be performed at room temperature, or performed by applying a predetermined temperature within a range in which the first graphene is not deformed.

In the present invention, the step (A2) is a step of preparing a second graphene coated with a polymer by spin-coating and curing the polymer on the upper surface of the graphene synthesized on the copper foil surface.

In the present invention, the step (A2) may be constituted by the following steps:

(A2a) spin-coating and curing the polymer on the upper surface of the graphene synthesized on of the copper foil surface;

(A2b) removing the copper by adding the graphene to a copper etchant solution after the completion of the step; and (A2c) preparing the second graphene coated with the polymer by putting the graphene in deionized water to remove the copper etchant solution.

The polymer used in the step (A2a) may be at least one selected from the group consisting of poly(methyl methacrylate), poly(bisphenol carbonate), polyvinylidenefluoride-hexafluoropropylene, polyethylene oxide, polyacrylonitrile and polyvinyl alcohol, and more preferably, at least one selected from the group consisting of poly(methyl methacrylate) and poly(bisphenol carbonate).

The spin-coating performed in the step (A2a) may be performed for 40 to 60 seconds at 1,000 to 2,000 rpm.

In the step (A2a), the graphene coated with the polymer may be cured at 60 to 80° C. to be used as a support layer.

The term "curing" used in the present invention means a reaction in which a flowable material is solidified by chemical reaction, moisture, volatilization of a solvent, and the like.

In the step (A2b), after the step (A2a) is completed, the copper may be removed by adding the copper foil to a copper etchant solution to remove the copper foil used in synthesizing the graphene. More specifically, the copper etchant solution may be added at 40 to 50° C.

The copper etchant solution may be iron chloride (Iron (III) chloride, $FeCl_3$), and is not limited thereto as long as the etchant solution is easy to remove the copper foil used to synthesize the graphene.

In the step (A2c), the second graphene coated with the polymer may be prepared by putting the graphene in deionized water to remove and wash the copper etchant solution.

In the present invention, the step (A3) may be constituted by the following steps:

(A3a) laminating the second graphene on the upper surface of the first graphene; and (A3b) after the step (A3a) is completed, preparing a graphene-carbon nanotube hybrid structure by adding the copper foil to the copper etchant solution to remove the copper foil used for the synthesis of the first graphene.

The step (A3a) may be to laminate the second graphene on the upper surface of the first graphene. More specifically, after the second graphene is laminated on the upper surface of the first graphene, air is blown to the upper surface of the second graphene using an air gun to remove the solvent and deionized water attached to the second graphene and dried at 50 to 80° C. to laminate the second graphene on the upper surface of the first graphene.

In order to remove the copper foil used in synthesizing the first graphene in the step (A3b), the copper foil may be added to the copper etchant solution. More specifically, while the first graphene and the second graphene are laminated, the copper foil may be added to the copper etchant solution to remove the copper foil used in synthesizing the first graphene. In addition, the copper etchant solution may be added at 40 to 50° C.

In the step (A3b), deionized water may be used to remove and wash the copper etchant solution.

The preparation method of the hybrid structure using the graphene-carbon nanotube according to the present invention is performed under a normal condition and easily applied to large-scale industry because side reactions hardly occur.

Perovskite Solar Cell Including Hybrid Structure Using Graphene-Carbon Nanotube

The present invention provides a perovskite solar cell including the hybrid structure using the graphene-carbon nanotube.

More specifically, the perovskite solar cell may comprise a substrate (glass); a first electrode formed on the substrate and including a fluorine doped thin oxide (FTO); an electron transfer layer formed on the first electrode and including a compact-titanium oxide (c-$TiO_2$); a mesoporous-titanium oxide (m-$TiO_2$) formed on the electron transfer layer; a perovskite layer formed on the m-$TiO_2$ and including a perovskite compound; and a graphene-carbon nanotube hybrid structure formed on the perovskite layer.

The hybrid structure using the graphene-carbon nanotube is as described above, and is the same unless contradicted to each other.

The term "perovskite solar cell" used in the present invention refers to a third-generation solar cell that includes a perovskite material having excellent properties as a photoactive layer.

The first electrode including the FTO is used as a transparent electrode and may generate electricity as electrons and holes are collected.

The perovskite compound may be methylammonium lead iodide ($MAPbI_3$).

The perovskite solar cell including the hybrid structure using the graphene-carbon nanotube of the present invention hardly corrodes or reacts even under humid and oxygen conditions and is not absorbed or penetrated into the hole conductive layer of the perovskite solar cell to replace existing spiro-OMeTAD and maintain the photovoltaic conversion efficiency of the solar cell.

Preparation Method of Perovskite Solar Cell Including Hybrid Structure Using Graphene-Carbon Nanotube The present invention provides a preparation method of the perovskite solar cell including the hybrid structure comprising the following steps:

(B1) laminating a fluorine doped tin oxide (FTO) on a substrate, and sequentially laminating and spin-coating a compact-titanium oxide (c-$TiO_2$) and a mesoporous-titanium oxide (m-$TiO_2$);

(B2) after the completion of the spin-coating, performing annealing at 450 to 550° C.;

(B3) after the completion of the annealing, preparing a substrate on which a perovskite layer is formed by spin-coating a perovskite compound on the m-$TiO_2$; and (B4) laminating the graphene-carbon nanotube hybrid structure on the perovskite layer with a laminator to prepare a perovskite solar cell.

The hybrid structure using the graphene-carbon nanotube is as described above, and is the same unless contradicted to each other.

In the present invention, in the step (B1), the fluorine doped tin oxide (FTO) may be laminated on the substrate, and the c-$TiO_2$ and the m-$TiO_2$ may be sequentially laminated and spin-coated.

The term "spin coating" used in the present invention is a method of preparing a thin film having a uniform thickness, and means a method of dropping a material to be coated on the substrate, and then spreading and drying the material in a large area by rotating the substrate at high speed.

The spin coating may be performed at 2,000 to 3,000 rpm for 20 to 60 seconds. After the spin coating is performed, the substrate on which the c-$TiO_2$ is laminated may be heat-treated at a temperature of 125° C. for 5 to 10 minutes.

Before performing the spin coating, the substrate on which the FTO is laminated may be surface-treated by a UV—$O_3$ or $O_2$ plasma method.

In the present invention, in the step (B2), after the completion of the step (B1), annealing of the m-$TiO_2$ may be performed at 450 to 550° C. for 0.5 to 2 hours.

The term "annealing" used in the present invention means a method of removing a heat history and an influence by processing remaining in the internal structure of the material by moderately heating the metal material.

In the present invention, in the step (B3), after the completion of the step (B2), the perovskite compound is spin-coated on the m-$TiO_2$ to prepare the substrate on which the perovskite layer is formed.

The spin coating may be performed at 2,000 to 3,000 rpm for 20 to 60 seconds.

In the present invention, in the step (B4), the graphene-carbon nanotube hybrid structure is spin-coated on the perovskite to prepare the perovskite solar cell.

More specifically, the step (B4) may be constituted by the following steps:

(B4a) laminating the graphene-carbon nanotube hybrid structure on the substrate on which the perovskite layer prepared in the step (B3) is formed; and (B4b) preparing the perovskite solar cell to which the graphene-carbon nanotube hybrid structure is adhered by pressing the laminated substrate 90 to 120° C. using laminator.

The term "laminator" used in the present invention refers to a device for making a thick plate by bonding several layers of thin plates.

In the step (B4b), the perovskite solar cell may be prepared by bonding the graphene-carbon nanotube hybrid structure using the laminator by applying pressure in a predetermined temperature condition.

In order to sufficiently appreciate the present invention, operational advantages of the present invention, objects to be achieved by embodiments the present invention, accompanying drawings illustrating the embodiments of the present invention and contents disclosed in the accompanying drawings should be referred.

Hereinafter, preferred Examples of the present invention will be described in detail with reference to the accompanying drawings. However in description of the present invention, the description for known functions or configurations will be omitted in order to clarify the gist of the present invention.

Reagents and solvents mentioned below were purchased from Sigma Aldrich unless otherwise noted.

Preparation Example 1. Preparation of Graphene Synthesized on Surface of Copper Foil A copper foil of high-purity was put in a hydrogen ($H_2$) conditions in a furnace of 1,030° C. for 30 minutes. Next, a graphene synthesized on the surface of the copper foil was by reacting in a methane ($CH_4$) conditions for 30 minutes and cooling the furnace to room temperature.

Preparation Example 2. Preparation of Carbon Nanotube 3 nm-thick alumina was deposited on an $SiO_2$ wafer substrate having an oxide layer and 3 nm-thick iron was deposited thereon by evaporation of an electron beam, and an Si substrate on which the iron catalyst was deposited was added to a furnace at 520° C. in an argon (Ar) gas atmosphere and reacted in a hydrogen ($H_2$) gas conditions for 2 minutes. Next, the furnace was heated to 700° C., the carbon nanotube was grown in an acetylene ($C_2H_2$) and hydrogen ($H_2$) conditions, and the furnace was cooled to room temperature to prepare a vertically aligned carbon nanotube.

Example 1. Preparation of Hybrid Film

1. Preparation of First Graphene

The carbon nanotube prepared in Preparation Example 2 was dry-spinning in the form of a film on the entire upper surface of the graphene synthesized on the surface of the copper foil prepared in Preparation Example 1. Then, the carbon nanotube was adhered to the upper surface of the graphene by spraying isopropyl alcohol on the carbon nanotube film-graphene. Finally, the isopropyl alcohol was dried to prepare a first graphene with the carbon nanotube coated on the upper surface.

2. Preparation of Second Graphene

Poly(methyl methacrylate) (PMMA) was spin-coated on the upper surface of the graphene synthesized on the surface of the copper foil prepared in Preparation Example 1, and cured at 70° C. for 30 minutes. Then, the curing reaction was completed, and copper was removed by adding the graphene to a copper etchant solution at 45° C., wherein the copper etchant solution was used with iron chloride (Iron(III) chloride, $FeCl_3$). Finally, the second graphene coated with the polymer was prepared by putting the graphene in deionized water to remove the copper etchant solution.

3. Preparation of Hybrid Structure

The second graphene was laminated on the upper surface of the prepared first graphene. Then, the copper etchant solution was added to remove the copper foil located on the lower surface of the first graphene and washed with deionized water to prepare the graphene-carbon nanotube hybrid structure of the present invention, which was illustrated in FIG. 2.

Figure 2:
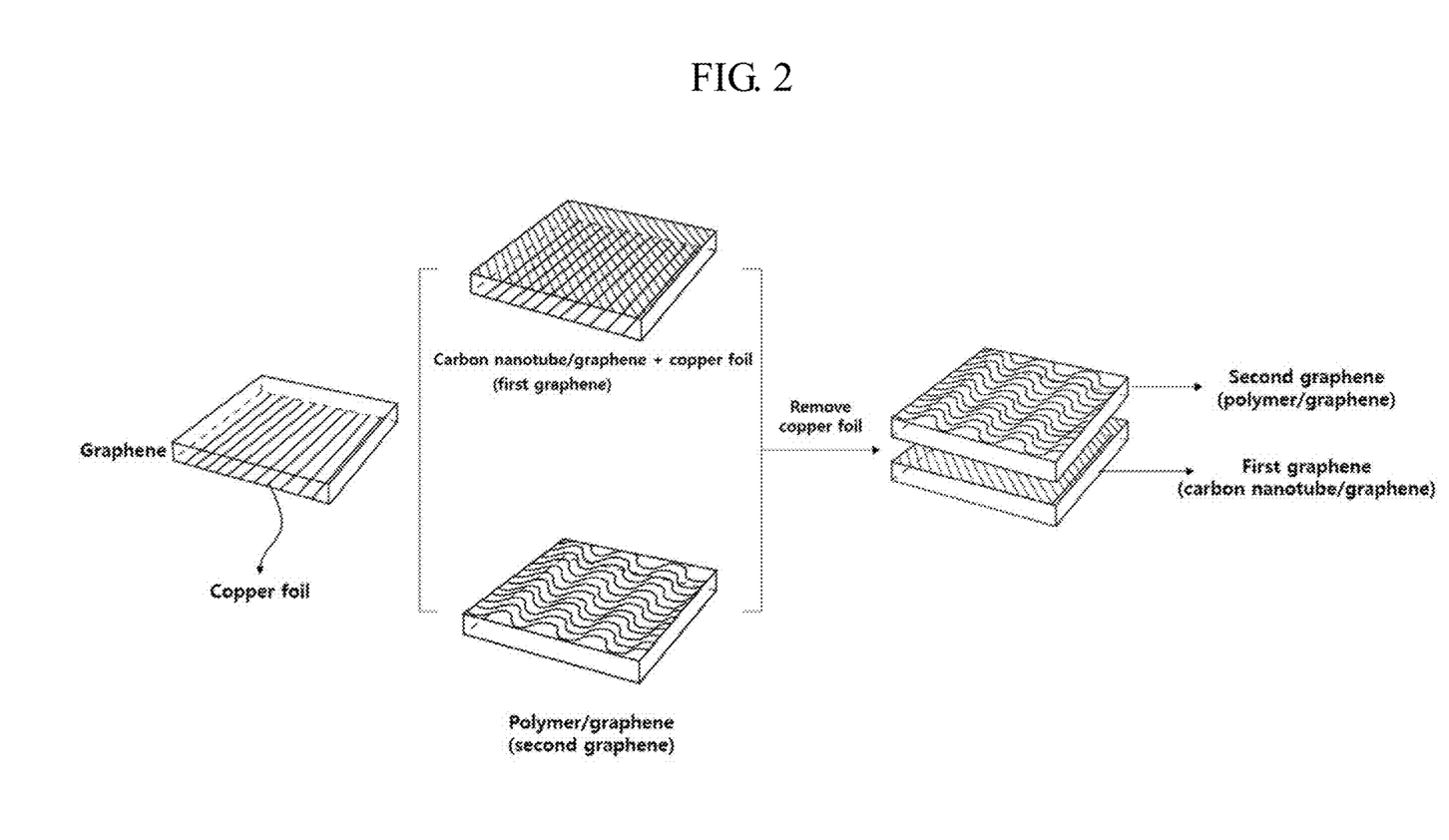
FIG. 2 is a diagram schematically illustrating a preparation method of the hybrid structure including the graphene-carbon nanotube of the present invention.
Figure 3:
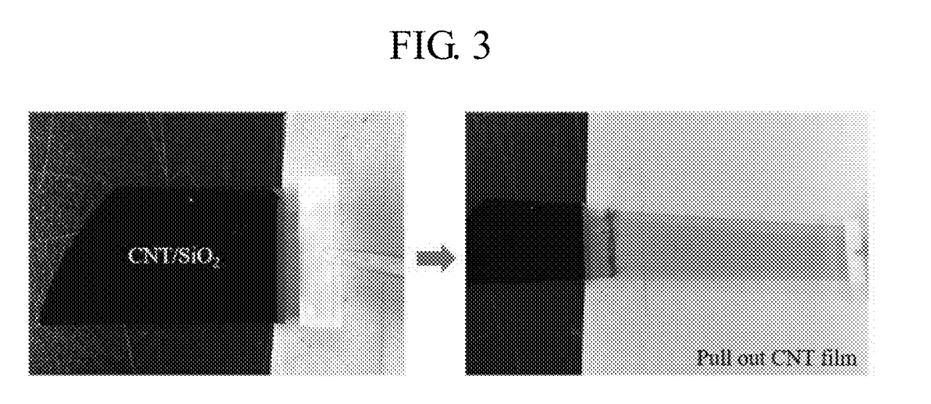
FIG. 3 is a diagram illustrating carbon nanotube dry spinning used in the preparation method of the hybrid structure including the graphene-carbon nanotube of the present invention.
Figure 4:
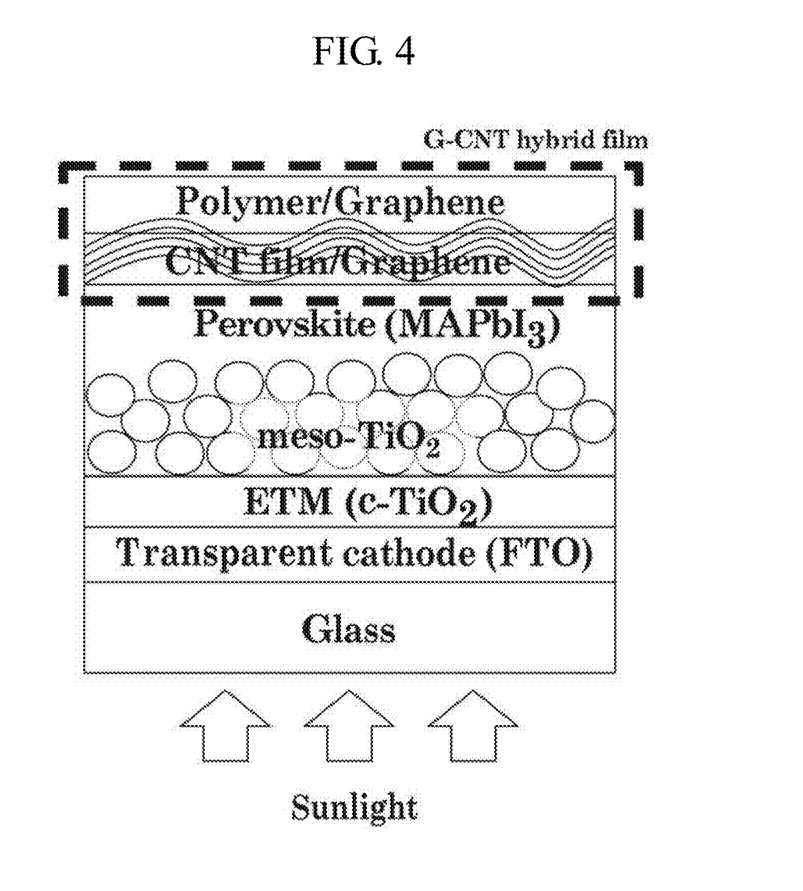
FIG. 4 is a diagram illustrating a structure of a perovskite solar cell comprising the hybrid structure including the graphene-carbon nanotube of the present invention.
Figure 5:
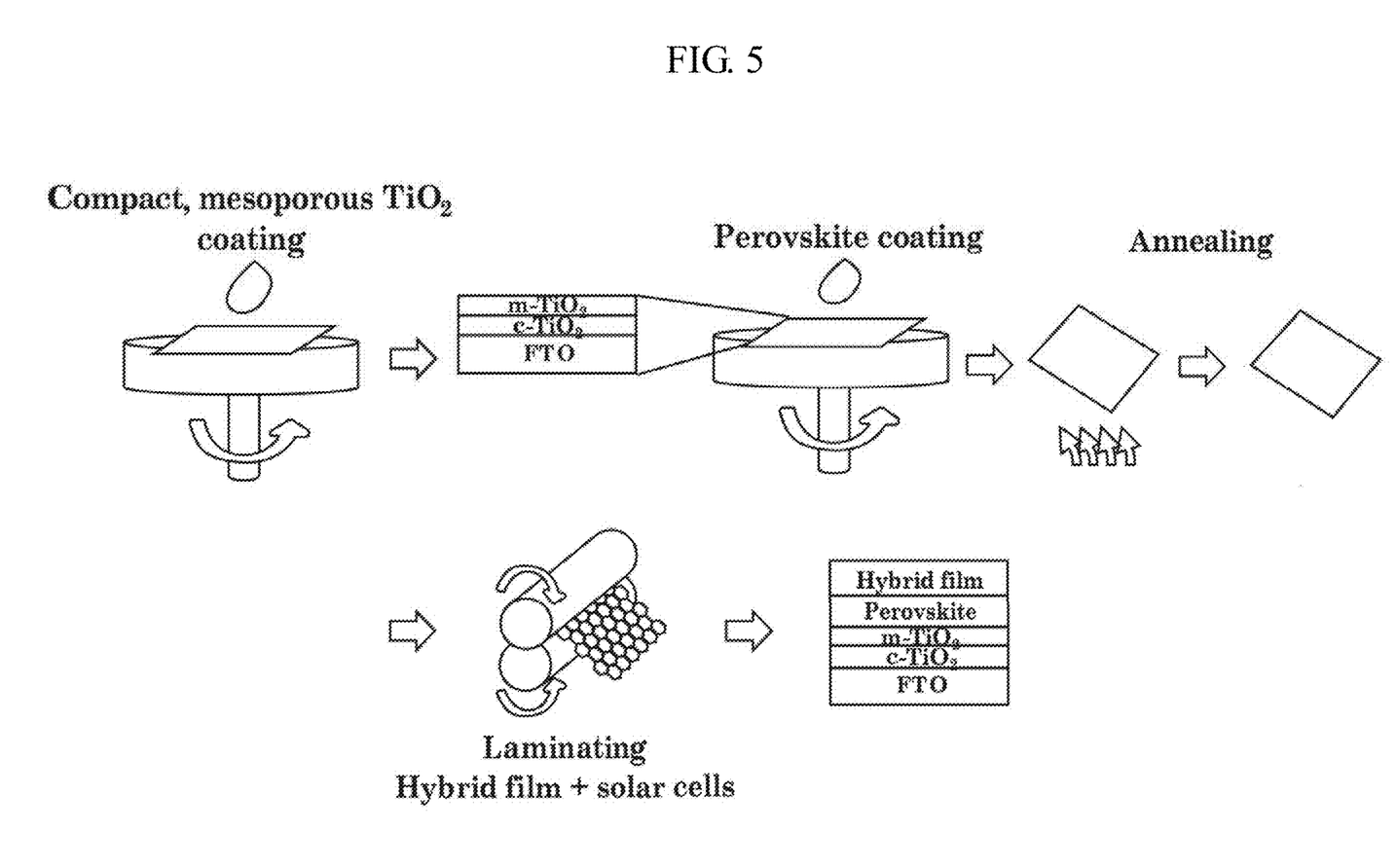
FIG. 5 is a diagram schematically illustrating a preparation method of the perovskite solar cell comprising the hybrid structure including the graphene-carbon nanotube of the present invention.

Referring to FIG. 2, the prepared hybrid structure was prepared in the form of the second graphene (top)-first graphene (bottom), more specifically, the polymer-graphene-carbon nanotube-graphene were laminated and formed in sequence.

Example 2. Preparation of Perovskite Solar Cell

A fluorine doped tin oxide (FTO) was laminated on the substrate, and a compact-titanium oxide (c-$TiO_2$) and a mesoporous-titanium oxide (m-$TiO_2$) were sequentially laminated and spin-coated. Then, after the spin coating was completed, annealing was performed at 500° C. and a perovskite compound was spin-coated on the m-$TiO_2$ to prepare a substrate on which a perovskite layer was formed. Next, a graphene-carbon nanotube hybrid structure was laminated on the perovskite layer and pressed using a laminator at 100° C., and finally, the laminated substrate was spin-coated to prepare the perovskite solar cell.

Test Example 1. Confirmation of Sheet Resistance

The following test was performed to confirm the sheet resistance of the structure prepared in Example 1 above.

First, four points of the structures prepared in Example was measured at intervals of 0.5 mm to calculate an average value thereof, and the results were shown in [Table 1] below.

TABLE 1

| | Sheet resistance (Ω/sq) |
|---|---|
| Example 1 | 419 |

Referring to [Table 1] above, it can be seen that the hybrid structure of Example 1 of the present invention has a sheet resistance value of 419 Ω/sq.

Test Example 2. Confirmation of Transmittance

The following test was performed using UV-vis spectroscopy (Model: EVO300 PC, Thermo Fisher Scientific) to confirm the transmittance to the structure of Example 1.

Figure 6:
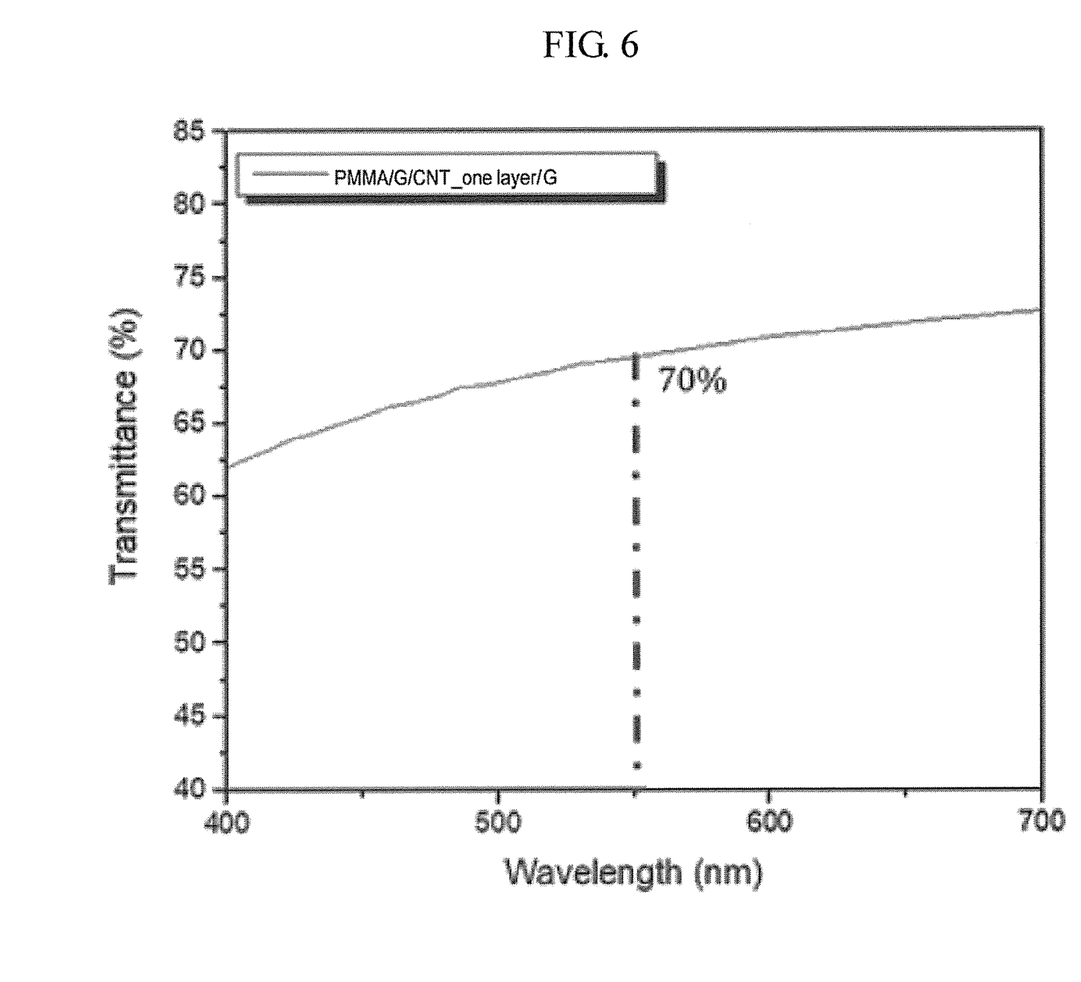
FIG. 6 is a graph showing film transmittance of the hybrid structure including the graphene-carbon nanotube of the present invention.

First, the transmittance was measured by irradiating a wavelength in the range of 400 to 700 nm using a Xenon (Xe) lamp of the UV-vis spectroscopy, and the results were shown in FIG. 6.

Referring to FIG. 6, it can be confirmed that in the case of Example 1 of the present invention, the transmittance of 70% was shown.

As described above, it will be appreciated by those skilled in the art that the present invention may be implemented into other specific forms without changing the technical spirit or required characteristics of the present invention. Thus, it is to be appreciated that the embodiments described above are illustrative in all aspects, and not restrictive.

What is claimed is:

1. A preparation method of a graphene-carbon nanotube hybrid structure comprising a graphene-carbon nanotube formed by laminating a second graphene coated with a polymer layer on an upper surface of a first graphene coated with a carbon nanotube layer,
wherein the first graphene has a first surface and an opposite second surface,
the carbon nanotube layer has a first surface and an opposite second surface, and is coated on the second surface of the first graphene,
the second graphene has a first surface and an opposite second surface, and is laminated on a surface of the carbon nanotube layer opposite the first graphene, and
the polymer layer has a first surface and an opposite second surface, and is directly coated on the second graphene on a surface of the second graphene opposite the carbon nanotube layer,
the preparation method comprising the steps:
(A1) preparing the first graphene coated with the carbon nanotube layer, wherein the first graphene is coated with a carbon nanotube by dry-spinning the carbon nanotube in a film form on an upper surface of a first graphene synthesized on a first copper foil surface, wherein the step (A1) comprises:
(A1a) dry-spinning the carbon nanotube in the form of a film on the upper surface of the first graphene synthesized on the first copper foil surface;
(A1b) bonding the carbon nanotube to the upper surface of the first graphene by spraying alcohol onto the first graphene from which the carbon nanotube is spun; and
(A1c) preparing the first coated graphene with the carbon nanotube coated on the upper surface by drying the alcohol;
(A2) preparing the second graphene coated with the polymer layer, wherein the second graphene is coated with a polymer by spin-coating and curing the polymer on the upper surface of a second graphene synthesized on a second copper foil surface, wherein the step (A2) comprises:
(A2a) spin-coating and curing the polymer directly on the upper surface of the second graphene synthesized on the second copper foil surface;
(A2b) removing the copper by adding the second graphene to a copper etchant solution after the completion of the step (A2a); and
(A2c) preparing the second coated graphene by putting the second graphene in deionized water to remove the copper etchant solution; and
(A3) preparing the graphene-carbon nanotube hybrid structure by laminating the second graphene coated with the polymer layer on the upper surface of the first graphene coated with the carbon nanotube layer, wherein the step (A3) comprises:
(A3a) laminating the second graphene coated with the polymer layer on the upper surface of the first graphene coated with the carbon nanotube layer; and
(A3b) after the step (A3a) is completed, preparing the graphene-carbon nanotube hybrid structure by adding the first copper foil to a copper etchant solution to remove the copper foil used for the synthesis of the first graphene,
wherein the first graphene synthesized on the first copper foil surface is prepared by a method comprising:
a step of putting a copper foil of high purity in a furnace at 1,000° C. to 1,100° C. in a hydrogen atmosphere;
a step of reacting the copper foil with methane in the furnace; and
a step of cooling the furnace to room temperature to prepare the graphene synthesized on the surface of the copper foil,
wherein the polymer in the polymer layer is at least one selected from the group consisting of poly(methyl methacrylate) (PMMA), poly(bisphenol A carbonate) (PC), polyvinylidenefluoride-hexafluoropropylene (PVDF-HFP), polyethylene oxide (PEO), polyacrylonitrile (PAN), and polyvinylalcohol (PVA).

2. A perovskite solar cell comprising:
a glass substrate;
a first electrode formed on the substrate and including a fluorine doped tin oxide (FTO);
an electron transfer layer formed on the first electrode and including a compact-titanium oxide (c-TiO2);
a mesoporous-titanium oxide (m-TiO2) formed on the electron transfer layer;
a perovskite layer formed on the m-TiO2 and including a perovskite compound; and
a hybrid structure formed on and directly in contact with the perovskite layer,
wherein the hybrid structure comprises a graphene-carbon nanotube formed by laminating a second graphene coated with a polymer layer on an upper surface of a first graphene coated with a carbon nanotube layer,
wherein the first graphene has a first surface and an opposite second surface,
the carbon nanotube layer has a first surface and an opposite second surface, and is coated on the second surface of the first graphene,
the second graphene has a first surface and an opposite second surface, and is laminated on a surface of the carbon nanotube layer opposite the first graphene, and
the polymer layer has a first surface and an opposite second surface, and is coated on the second graphene on a surface of the second graphene opposite the carbon nanotube layer,
wherein the perovskite compound is methylammonium lead iodide (MAPbI3).

3. A preparation method of a perovskite solar cell comprising the steps:
(B1) laminating a fluorine doped tin oxide (FTO) on a substrate, and sequentially laminating and spin-coating a compact-titanium oxide (c-TiO2) and a mesoporous-titanium oxide (m-TiO2);
(B2) after the completion of the spin-coating, performing annealing at 450 to 550° C.;
(B3) after the completion of the annealing, preparing a perovskite layer by spin-coating a perovskite compound on the m-TiO2; and
(B4) laminating a hybrid structure directly on the perovskite layer with a laminator to prepare a perovskite solar cell,
wherein the step (B4) comprises:
(B4a) laminating the graphene-carbon nanotube hybrid structure directly on the substrate on which the perovskite layer prepared in the step (B3) is formed; and
(B4b) preparing the perovskite solar cell to which the graphene-carbon nanotube hybrid structure is adhered by pressing the laminated substrate at 90 to 120° C. using the laminator, wherein the hybrid structure comprises a graphene-carbon nanotube formed by laminating a second graphene coated with a polymer layer on an upper surface of a first graphene coated with a carbon nanotube layer, wherein the first graphene has a first surface and an opposite second surface, the carbon nanotube layer has a first surface and an opposite second surface, and is coated on the second surface of the first graphene, the second graphene has a first surface and an opposite second surface, and is laminated on a surface of the carbon nanotube layer opposite the first graphene, and the polymer layer has a first surface and an opposite second surface, and is coated on the second graphene on a surface of the second graphene opposite the carbon nanotube layer.

4. The perovskite solar cell of claim 2, wherein the hybrid structure formed on the perovskite layer is a graphene-carbon nanotube hybrid structure prepared by a preparation method comprising the steps:

(A1) preparing the first graphene coated with the carbon nanotube layer, wherein the first graphene is coated with a carbon nanotube by dry-spinning the carbon nanotube in a film form on an upper surface of a first graphene synthesized on a first copper foil surface, wherein the step (A1) comprises:

(A1a) dry-spinning the carbon nanotube in the form of a film on the upper surface of the first graphene synthesized on the first copper foil surface;

(A1b) bonding the carbon nanotube to the upper surface of the first graphene by spraying alcohol onto the first graphene from which the carbon nanotube is spun; and (A1c) preparing the first coated graphene with the carbon nanotube coated on the upper surface by drying the alcohol;

(A2) preparing the second graphene coated with the polymer layer, wherein the second graphene is coated with a polymer by spin-coating and curing the polymer on the upper surface of a second graphene synthesized on a second copper foil surface, wherein the step (A2) comprises:

(A2a) spin-coating and curing the polymer directly on the upper surface of the second graphene synthesized on the second copper foil surface;

(A2b) removing the copper by adding the second graphene to a copper etchant solution after the completion of the step (A2a); and (A2c) preparing the second coated graphene by putting the second graphene in deionized water to remove the copper etchant solution; and (A3) preparing the graphene-carbon nanotube hybrid structure by laminating the second graphene coated with the polymer layer on the upper surface of the first graphene coated with the carbon nanotube layer, wherein the step (A3) comprises:

(A3a) laminating the second graphene coated with the polymer layer on the upper surface of the first graphene coated with the carbon nanotube layer; and (A3b) after the step (A3a) is completed, preparing the graphene-carbon nanotube hybrid structure by adding the first copper foil to a copper etchant solution to remove the copper foil used for the synthesis of the first graphene, wherein the first graphene synthesized on the first copper foil surface is prepared by a method comprising:

a step of putting a copper foil in a furnace at 1,000° C. to 1,100° C. in a hydrogen atmosphere;

a step of reacting the copper foil with methane in the furnace; and a step of cooling the furnace to room temperature to prepare the graphene synthesized on the surface of the copper foil, wherein the polymer in the polymer layer is at least one selected from the group consisting of poly(methyl methacrylate) (PMMA), poly(bisphenol A carbonate) (PC), polyvinylidenefluoride-hexafluoropropylene (PVDF-HFP), polyethylene oxide (PEO), polyacrylonitrile (PAN), and polyvinylalcohol (PVA).

5. The preparation method according to claim 3, wherein the hybrid structure is a graphene-carbon nanotube hybrid structure prepared by a preparation method comprising the steps:

(A1) preparing the first graphene coated with the carbon nanotube layer, wherein the first graphene is coated with a carbon nanotube by dry-spinning the carbon nanotube in a film form on an upper surface of a first graphene synthesized on a first copper foil surface, wherein the step (A1) comprises:

(A1a) dry-spinning the carbon nanotube in the form of a film on the upper surface of the first graphene synthesized on the first copper foil surface;

(A1b) bonding the carbon nanotube to the upper surface of the first graphene by spraying alcohol onto the first graphene from which the carbon nanotube is spun; and (A1c) preparing the first coated graphene with the carbon nanotube coated on the upper surface by drying the alcohol;

(A2) preparing the second graphene coated with the polymer layer, wherein the second graphene is coated with a polymer by spin-coating and curing the polymer on the upper surface of a second graphene synthesized on a second copper foil surface, wherein the step (A2) comprises:

(A2a) spin-coating and curing the polymer directly on the upper surface of the second graphene synthesized on the second copper foil surface;

(A2b) removing the copper by adding the second graphene to a copper etchant solution after the completion of the step (A2a); and (A2c) preparing the second coated graphene by putting the second graphene in deionized water to remove the copper etchant solution; and (A3) preparing the graphene-carbon nanotube hybrid structure by laminating the second graphene coated with the polymer layer on the upper surface of the first graphene coated with the carbon nanotube layer, wherein the step (A3) comprises:

(A3a) laminating the second graphene coated with the polymer layer on the upper surface of the first graphene coated with the carbon nanotube layer; and (A3b) after the step (A3a) is completed, preparing the graphene-carbon nanotube hybrid structure by adding the first copper foil to a copper etchant solution to remove the copper foil used for the synthesis of the first graphene, wherein the first graphene synthesized on the first copper foil surface is prepared by a method comprising:

a step of putting a copper foil in a furnace at 1,000° C. to 1,100° C. in a hydrogen atmosphere;

a step of reacting the copper foil with methane in the furnace; and a step of cooling the furnace to room temperature to prepare the graphene synthesized on the surface of the copper foil, wherein the polymer in the polymer layer is at least one selected from the group consisting of poly(methyl methacrylate) (PMMA), poly(bisphenol A carbonate) (PC), polyvinylidenefluoride-hexafluoro-propylene (PVDF-HFP), polyethylene oxide (PEO), polyacrylonitrile (PAN), and polyvinylalcohol (PVA).

* * * * *